(12) United States Patent
Gillissen et al.

(10) Patent No.: US 10,670,741 B2
(45) Date of Patent: Jun. 2, 2020

(54) SCINTILLATOR

(71) Applicant: VAREX IMAGING CORPORATION, Salt Lake City, UT (US)

(72) Inventors: Eduard Gillissen, Scheulder (NL); Erik Jacobs, Brunssum (NL); Nurcan Dogan, Eindhoven (NL)

(73) Assignee: VAREX IMAGING CORPORATION, Salt Lake City, UT (US)

( * ) Notice: Subject to any disclaimer, the term of this patent is extended or adjusted under 35 U.S.C. 154(b) by 19 days.

(21) Appl. No.: 15/560,135

(22) PCT Filed: Mar. 20, 2015

(86) PCT No.: PCT/NL2015/050181
§ 371 (c)(1),
(2) Date: Sep. 20, 2017

(87) PCT Pub. No.: WO2016/153335
PCT Pub. Date: Sep. 29, 2016

(65) Prior Publication Data
US 2018/0100935 A1    Apr. 12, 2018

(51) Int. Cl.
| G01T 1/202 | (2006.01) |
| G01T 1/20 | (2006.01) |
| H01L 27/146 | (2006.01) |
| H01L 27/30 | (2006.01) |
| G21K 4/00 | (2006.01) |

(52) U.S. Cl.
CPC ............ G01T 1/202 (2013.01); G01T 1/2002 (2013.01); H01L 27/14663 (2013.01);
(Continued)

(58) Field of Classification Search
CPC .. G01T 1/202; G01T 1/2002; H01L 27/14663
See application file for complete search history.

(56) References Cited

U.S. PATENT DOCUMENTS

| 6,177,030 B1 * | 1/2001 | Shoji | .................... C09K 11/025 |
| | | | 252/301.4 H |
| 6,262,422 B1 * | 7/2001 | Homme | ................ G01T 1/2018 |
| | | | 250/367 |

(Continued)

FOREIGN PATENT DOCUMENTS

| DE | 10 2010 041525 A1 | 3/2012 |
| EP | 1398648 A2 | 3/2004 |

(Continued)

OTHER PUBLICATIONS

Translation of German Patent Application Publication DE 102010041525 to Oliver et al. (Year: 2013).*

(Continued)

*Primary Examiner* — Kenneth J Malkowski
(74) *Attorney, Agent, or Firm* — Maschoff Brennan

(57) ABSTRACT

The present invention is in the field of an improved scintillator for X-rays, use of the inventive scintillator, an X-ray detector comprising the present scintillator, and a method of producing an improved scintillator. A scintillator converts X-rays into visible light; high performance scintillators are typically made of a crystalline material.

20 Claims, 3 Drawing Sheets

(52) U.S. Cl.
CPC .......... *H01L 27/308* (2013.01); *G01T 1/2018* (2013.01); *G21K 2004/10* (2013.01); *G21K 2004/12* (2013.01)

(56) References Cited

U.S. PATENT DOCUMENTS

| | | |
|---|---|---|
| 7,897,931 B2 | 3/2011 | De Godzinsky |
| 2008/0308736 A1 | 12/2008 | Suzuki et al. |

FOREIGN PATENT DOCUMENTS

| | | |
|---|---|---|
| EP | 2453263 | 5/2012 |
| JP | H05-196742 | 8/1993 |
| JP | 2003004854 | 1/2003 |
| JP | 2004-219172 | 8/2004 |
| JP | 2009-540282 | 11/2009 |
| JP | 2012-181108 | 9/2012 |
| WO | 99/66349 | 6/1999 |
| WO | 2007134914 A1 | 11/2007 |
| WO | 2009/034782 | 3/2009 |
| WO | 2011065302 | 6/2011 |

OTHER PUBLICATIONS

International Search Report dated Dec. 2, 2015 in related PCT Application No. PCT/NL2015/050181 (3 pages).
Written Opinion dated Dec. 2, 2015 in related PCT Application No. PCT/NL2015/050181 (6 pages).

* cited by examiner

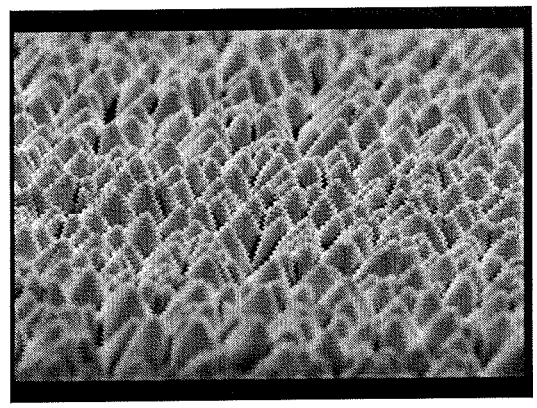
Fig. 1
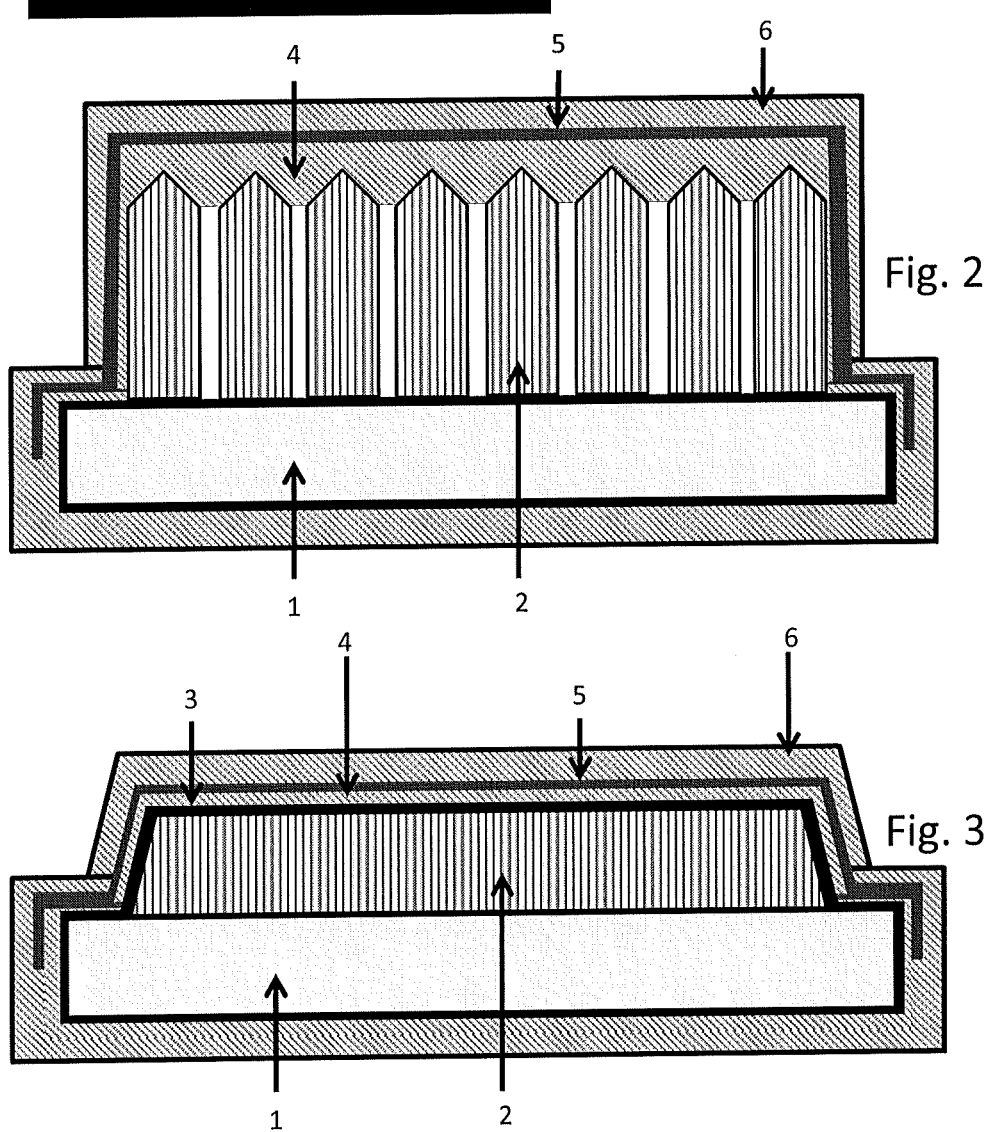
Fig. 2
Fig. 3

SCINTILLATOR

CROSS-REFERENCE TO RELATED APPLICATIONS

This application claims the benefit of PCT Application No. PCT/NL2015/050181 filed Mar. 20, 2015, which is incorporated herein by reference in its entirety.

FIELD

The present disclosure is in the field of a scintillator.

BACKGROUND

A scintillator converts X-rays into visible light. High performance scintillators can be made of a crystalline material, such as CsI. The light can be detected by a sensor e.g. comprising arrays of diodes, a photographic plate, and a charge coupled device (CCD) plate. An image formed accordingly is called a radiogram.

In a scintillator two main performance parameters are typically considered, namely light output performance and modulation transfer function.

The modulation transfer function (MTF) is the spatial frequency response of an imaging system or a component. It is the contrast at a given spatial frequency relative to low frequencies. The MTF is preferably as high as possible.

On a radiogram, objects having different sizes and opacity are displayed with different gray-scale values. MTF is responsible for converting contrast values of different-sized objects (object contrast) into contrast intensity levels in the image (image contrast). For general imaging, the relevant details are in a range between 0 and 2 cycles/mm, which demands high MTF values.

In summary, MTF is the capacity of the detector to transfer the modulation of the input signal at a given spatial frequency to its output.

MTF is a useful measure of true or effective resolution, since it accounts for the amount of blur and contrast over a range of spatial frequencies.

In an example a prior art scintillator is grown on a substrate and has a pillar structure. Due to crystallographic limitations the pillars have a cone-like shape at the top. It has been found that often the pillar diameter is bigger at the top of the pillars compared to the bottom (substrate side) thereof. Each pillar is considered to act as sort of a wave guide for the light and helps maintaining the spatial resolution of the image, e.g. on the CCD or diode array detector.

On the scintillator pillars typically a leveling layer is applied in order to cover the top of the (CsI) pillars. It has been found that the leveling layer preferably should not penetrate in between the pillars. It is believed that this causes the decrease of MTF as light can leave the pillars and show spatial cross-talk.

A problem is that when (moist sensitive) scintillating material is exposed to humid air, the scintillator efficiency starts to change and the image quality degrades over the course of time in terms of MTF and the noise level of the image. For this reason scintillating layers have to be covered with a sealing (or barrier) layer. A disadvantage of sealing layers is that upon application thereof it is difficult to maintain the spatial resolution (MTF). Typically on top of the leveling layer a barrier layer is placed. This layer prevents the penetration of moisture toward the leveling layer and scintillator layer to some extent.

The prior art barrier layers are typically not hermitic, thereby causing degradation of the scintillator over time, e.g. in terms of MTF and output performance.

Also barrier layers are of insufficient quality, e.g. in terms of uniform coverage, uniform characteristics, layer thickness, etc. Such is partly due to inherent complexity of the scintillator, e.g. pillar like structure scintillator material.

Also prior art barrier layers are not good enough at elevated temperatures and/or elevated hygroscopicity, especially over time, and not being hermetic, especially not in combination with improved optical characteristics.

Incidentally some documents recite such barrier layers.

For instance, DE 10 2010 041525 A1 recites a scintillator which is stabilized in terms of moisture. In view of the hygroscopic nature of scintillator material the material is protected from moisture by a so-called atomic layer deposition technique. This layer provides a more isotropic covering for high aspect ratio materials that are typically used for scintillators.

Further EP 1 398 648 A2 recites prevention of an interlayer cleavage between a phosphor layer and a moisture-preventing protective layer. In a radiation converting substrate constituted by forming at least a phosphor layer composed of an alkali halide for converting a radiation into light and a light emission activator, and a moisture-preventing protective layer in succession on a radiation-transmitting substrate, the moisture-preventing protective layer is constituted of a first plasma polymerization film formed from a monomer of a silane compound, and a second plasma polymerization film formed from a monomer of a fluorine-containing unsaturated hydrocarbon.

EP 2 453 263 A2 recites an X-ray detector that has a hybrid photoactive layer that is provided between an cathode and a substrate. The hybrid photoactive layer has several scintillators and a bulk heterojunction to perform indirect X-ray conversion by bulk heterojunction that is designed to absorb light in wavelength range of scintillating radiation of scintillators, so as to form electron-hole pairs that are detected electrically. The bulk heterojunction comprises organic semiconductor materials that are soluble and can be deposited via a spraying process. An independent claim is included for method for manufacturing X-ray detector.

And WO2011/065302 A1 recites a support for a roll-shaped scintillator panel; a scintillator panel which can be produced by an uncomplicated process with high productivity and has improved moisture resistance performance; a process for producing the scintillator panel; and a radiation image detector equipped with the scintillator panel. The support for a roll-shaped scintillator panel is characterized by comprising a base material and a metal thin film layer that has a thickness of 1 to 500 nm and is arranged on the base material. The scintillator panel comprises the support and a fluorescent layer arranged on the support, and is characterized in that each of the light-emitting surface and the side surfaces of the fluorescent layer and the side surfaces of the support is covered with a moisture-resistant protective film.

In view of the above problems there is a need for an improved scintillator which overcomes one or more of the above disadvantages, without jeopardizing functionality and advantages.

SUMMARY

The present disclosure relates to an improved scintillator for X-rays.

The present disclosure relates to use of ALD (Atomic Layer Deposition) for depositing two or more very thin layers in the range of up to 1000 nm thickness that is up to in the order of 1000 atomic layers. It is noted that the term "layer" in this respect relates to a (semi) continuous deposition that is continued until a layer having a physical thickness is obtained; at least one atomic c.q. molecular layer is deposited, but typically a number of atomic/molecular layers is deposited. The process then is stopped, and thereafter a next comparable physical layer is deposited. The next comparable layer typically has a different composition from the previous layer, but not necessarily. However at least two compositions are used; hence, at least one subsequent layer is different from a directly previous layer. In an example case each subsequent layer is different from each previous layer. In other words the composition of the next layer may be changed compared to the composition of the previous layer, and may be changed each and every time.

Thereby, in terms of composition (and further characteristics) a heterogeneous stack of layers is formed. As a consequence of the intermittent process a cross sectional view (such as by transmission electron microscopy (TEM)) in principle reveals the stack of layers as "individual" layers, stacked on top of one and another. Such is different from a stack which is deposited continuously and (if only one composition would have been used) would have no visible (stack of) layers. Apparently the present stack of layers has different characteristics compared to e.g. a thick layer grown by a similar or the same prior art technique. Thereby a very thin (stack of) layers is provided as compared to existing solutions, which have micrometer (>1,000 nm) thick barrier layers. In an example the present moisture barrier layer can include one or more individual ALD layers of e.g. inorganic layers, such as $Al_2O_3$($TiO_2$, SiN, $SiO_2$, and similar materials. The present stack of layers has in summary improved characteristics over the prior art, e.g. in terms of being hermetic, optical properties The present barrier structure may be pinhole free. The present barrier may not influence characteristics of the scintillator, such as MTF, negatively. The present ALD Inorganic multilayer (nanolaminate) is considered unique.

It has been found experimentally that the thickness of a layer stack affects the MTF. It is shown that the leveling layer thickness, a protective layer thickness, and a position distance each have a significant (negative) impact on the MTF of the scintillator plate. As the present barrier provides good moisture barrier properties, the thicknesses of other layers, such as the leveling layer and protective layer, which layers also provide some barrier properties, can be kept much smaller (thinner). As a result an overall performance, e.g. in terms of MTF, is much better with the present barrier.

On top of the ALD layer an extra layer for mechanical protection can be deposited such as layer including Parylene. Parylene is the trade name for a variety of chemical vapor deposited (CVD) poly (p-xylylene) polymers, typically used as moisture and dielectric barriers. It has been found experimentally that the protective layer thickness has an impact on Noise Power Spectrum (before and after quality test). The noise power spectrum (NPS) is considered a useful metric for understanding noise content in images; the higher a value, the better. For examples of the present scintillator a value of 6.0 is considered minimal. Such a value can be achieved with the disclosed embodiments, in a reliable and controlled manner.

Using the concepts described herein, the applied layers can be as thin as possible and of good quality, thereby maintaining performance and providing advantages as mentioned throughout the description.

Some general aspects of Atomic layer deposition (ALD) are detailed below. It relates to a thin film deposition technique that is based on the sequential use of a gas phase chemical process. The majority of ALD reactions use two chemicals, typically called precursors. These precursors react with a surface one at a time in a sequential, self-limiting, manner. By exposing the precursors to the growth surface repeatedly, a thin film is deposited.

ALD is considered a self-limiting (the amount of film material deposited in each reaction cycle is constant), sequential surface chemistry that deposits conformal thin-films of materials onto substrates. ALD film growth makes atomic scale deposition control possible. ALD is considered similar in chemistry to chemical vapor deposition (CVD), except that the ALD reaction breaks the CVD reaction into two half-reactions, keeping the precursor materials separate during the reaction.

ALD can be used to deposit several types of thin films, including various oxides (e.g. $Al_2O_3$, $TiO_2$, $SnO_2$, ZnO, $HfO_2$), metal nitrides (e.g. TiN, TaN, WN, NbN), metals (e.g. Ru, Ir, Pt), and metal sulfides (e.g. ZnS).

The growth of material layers by ALD may include repeating the following four steps:

(i) Exposure of a first precursor, typically an organometallic compound.

(ii) Purge or evacuation of a reaction chamber to remove the non-reacted precursors and gaseous reaction by-products.

(iii) Exposure of a second precursor—or another treatment to activate the surface again for the reaction of the first precursor, such as a plasma.

(iv) Purge or evacuation of the reaction chamber.

Each reaction cycle adds a given amount of material to the surface, referred to as the growth per cycle. To grow a material layer, reaction cycles are repeated as many times as required for a desired film thickness. One cycle may take time from 0.5 s to a few seconds and deposit between 0.1 and 3 Å of film thickness.

The present ALD-grown films are found to be extremely conformal and uniform in thickness.

Thereby the present disclosure provides a solution to one or more of the above mentioned problems.

Advantages of the present description are detailed throughout the description.

BRIEF DESCRIPTION OF THE DRAWINGS

FIG. 1 is a scanning electron microscope image of an example embodiment of a pillar structure.

FIGS. 2-8 are schematic cross-sectional views of example scintillator embodiments.

DETAILED DESCRIPTION

Figure 4:
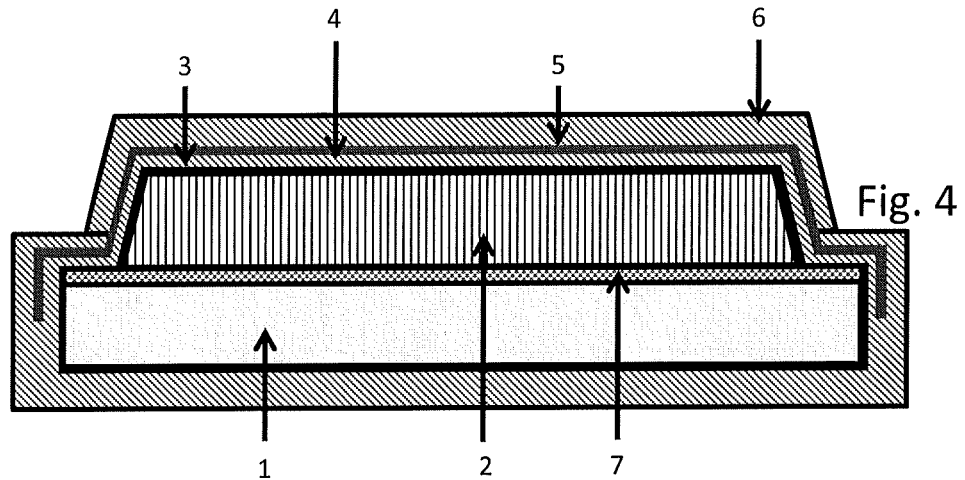

The present disclosure relates in a first aspect to an improved scintillator for X-rays.

The present scintillator comprises a substrate layer. In an example the plate layer is selected from an aluminium plate, a fibre optic plate, and a carbon plate. It is noted, as is shown in the figures that in case of a fibre optic plate a scintillator layer is preferably placed on the plate, whereas in case of an aluminium plate and a carbon plate a scintillator is preferably place below the plate. Aluminium is preferred if relatively high energy X-rays need to be detected, carbon is preferred when relatively low energy X-rays need to be detected. Carbon also matches well with a glass substrate.

A substrate or plate typically has a thickness of 0.3-100 mm. In an example an aluminium plate has a thickness of 0.3-1.0 mm, a fibre optic plate has a thickness of 1-4 mm and a carbon plate has a thickness of 0.5-2.0 mm. In an exam-pie a plate protects a sensor, typically provided under the plate, from being damaged by X-rays. A thickness of the plate is typically adapted to the energy of X-rays being used, in a specific application or over a range of applications.

A carbon plate may be provided with a reflector.

The present scintillator may find application in relatively large devices, having an area of e.g. 0.5*0.5 m$^2$, and in relatively small devices, having an area of e.g. 1*1 cm$^2$. Typical sizes provided are circular plates with diameters of 15 cm, 23 cm, 31 cm and 38 cm, rectangular plates with dimensions of 20*40 cm$^2$, 44*44 cm$^2$, 5*5 cm$^2$, 20*1 cm$^2$, and an octagonal plate of 5*3 cm$^2$. In other words the present scintillator is applicable over a wide range of surface areas. The present scintillator is preferably a substantially flat scintillator.

The present scintillator layer may have a thickness of 100-3000 µm. For relatively low energy X-rays the thickness may be 100-300 µm, such as 120-200 µm, whereas for relatively high energy X-rays the thickness may be in 500-3000 µm, such as 1000-2000 µm. An X-ray energy used is typically from 1 keV (low energy) to 400 keV (high energy), such as from 10 keV-300 keV.

In an example the scintillator material is selected from crystalline CsI, TlI, such as doped or undoped CsI. It is noted that many crystalline materials and salts are (somewhat) hygroscopic, such as CsI and TlI. In (high) vacuum applications hygroscopicity is often not an issue. Under typical conditions a scintillator is applied at a hygroscopicity which over time deteriorates the scintillator. Protection of the scintillator is therefore needed. The present scintillator can be applied under relatively high humidity (95% RH at 25° C.) without deterioration.

The scintillator material is preferably deposited or grown directly on the substrate. Such improves characteristics of the present scintillator, such as an improved transmission.

The scintillator material may be tuned for a given sensor, such as by doping and forming mixed crystals. For instance doping CsI with Na may provide light with a 420 nm wavelength; doping CsI with Ti may provide light with a 560 nm wavelength.

In an example the scintillator material is a pillar type structure. The length of the pillars, or likewise the thickness of the scintillator, may be varied and adapted to requirements. A characteristic of the pillars is that typically some space is left in between the pillar. Such space is important for spatial resolution of the scintillator. Also (a fraction of the) pillars tend to be somewhat broader on a top side thereof. A typical diameter if CsI pillars is from 1-20 µm, such as from 3-10 µm.

The present scintillator is characterized in that the first moisture barrier layer has a thickness of 10 nm-1000 nm. Such is considered an extremely thin layer in the field. The present barrier layer is hermetic and has a high density, that is provides a superior moisture barrier. The present barrier layer comprises two or more layers each individually having a thickness of 0.5 nm-100 nm, such as 1-50 nm, or having two or more hybrid layers, or combinations thereof. It is noted that a typical prior art layer comprises only one layer with a much larger thickness. It is also noted that depositing a layer on a relatively rough structure, such as the present scintillator layer, is inherently complex.

In an example the first moisture barrier layer comprises a relatively large number of layers, such as 3-50 layers, preferably 5-30 layers, more preferably 10-20 layer. Especially combinations of different layers have been found to provide good characteristics, e.g. in terms of a moisture barrier being hermetic.

In an example the first moisture barrier layer has a thickness of 20 nm-500 nm, preferably 50 nm-250 nm, more preferably 100 nm-150 nm. The thickness is preferably as small as possible, e.g. in view of MTF. The thickness is also large enough to provide a good moisture barrier. It has been found that a very thin barrier layer, comprising some 15 layers, provides an excellent moisture barrier and hardly influences other characteristic of the scintillator, such as MTF. For small thicknesses no noticeable negative effect on characteristics could be observed.

In an example the first moisture barrier layer comprises layers, each layer comprising a material, individually selected from metals, such as Al, metal oxides, such as $TiO_2$, $Al_2O_3$, ZnO, $SiO_2$, metal nitrides, such as TiN, Si3N, preferably a sequence of 5-50 $Al_2O_3$ and $TiO_2$ layers such as 10-20 layers. Subsequent layers preferably have a thickness of 1-10 nm. A total thickness in an example is 50-200 nm, such as 100-150 nm. The first moisture barrier layer is preferably applied on a first leveling layer.

In an example of the present scintillator the scintillator layer is covered with an adhesion layer. The adhesion layer improves characteristics of a subsequent applied leveling layer, such as coverage, and it also improves adhesion of e.g. a leveling layer, especially towards the substrate, for instance of Parylene-C. It is now possible to adhere such a leveling layer also on sides of the substrate, especially in case of a Fibre Optic Plate (FOP). It is a known problem that adhesion of Parylene-C on e.g. FOP is limited. Also various leveling layers, such as parylene, tend to peel off over time. The adhesion layer comprises a material selected from saturated linear and branched hydrosilicons ($Si_nH_{2n+2}$)/preferably wherein n e [1, 6]. The adhesion layer preferably is a silane type layer, such as monosilane and disilane. It has been found that especially silanes can be applied very well on the present scintillator material. A specific advantage of using silane is that it avoids grinding as an extra step, which on top of that may cause dirt by particles. Indirectly also characteristics of further applied layers are improved. Despite that silanes have found wide application, silanes have not been used to the knowledge of the inventors in scintillators.

The present scintillator may further comprise one or more of a leveling layer on the scintillator layer, a first protective layer, a second protective layer, and a second moisture barrier layer.

The one or more leveling layers may have a thickness which can be related to a thickness of the scintillator material. It is preferred that the leveling layer has a thickness of 1-5% of a thickness of the scintillator layer, such as 1.5-3%. In other words a relatively thin scintillator layer may have a relatively thin levelling layer, and likewise a relatively thick scintillator layer may have a relatively thick leveling layer. In an example the leveling layer has a thickness of 3-20 µm, preferably 5-15 µm, such as 8-10 µm.

It is noted that applying a barrier layer on a flat surface, such as glass, is intrinsically much easier than applying a similar layer on a rough, pillar like structure.

There rough structures preferably use a leveling layer to provide some surface flatness. Also inter-pillar space is covered. It has been found experimentally that optimal results in terms of e.g. barrier properties are achieved when a leveling layer is not too thin.

A leveling layer and other layers, preferably have comparable refractive indices, such as about 1.62 for a leveling layer, and about 1.79 for a scintillator layer. Preferably the respective refractive indices are equal to a refractive index of the scintillator layer±20% (e.g. 1.79±0.36), more preferably ±10% (e.g. 1.79±0.18).

In an example the leveling layer comprises a material selected from aromatic polymers, such as poly (p-xylylene) (parylene), such as parylene C, and parylene N. These materials have been found to provide a good coverage, that level the scintillator pillars, provide a relatively flat and smooth surface, can be applied easily, and do not or at the most slightly penetrate in between pillars.

In an example the optional second moisture barrier layer comprise layers, each layer comprising a material, individually selected from metals, such as Al, metal oxides, such as $TiO_2$, $Al_2O_3$, ZnO, $SiO_2$, metal nitrides, such as TiN, $Si_3N_4$, preferably a sequence of 5-50 Al and $TiO_2$ layers such as 10-20 layers. The first and second moisture barrier layers may have comparable characteristics and may be formed in a similar way. Subsequent layers preferably have a thickness of 1-10 nm. A total thickness in an example is 50-200 nm, such as 100-150 nm. Characteristics of the first and second moisture barrier layer may be selected independently. The second moisture barrier layer is preferably applied on a protective layer.

In an example the first and optional second protective layer comprises a material, each individually, selected from aromatic polymers, such as poly (p-xylylene) (parylene), such as parylene C, and parylene N. These materials have been found to provide a good coverage, that protect the scintillator pillars from mechanical impact, provide a relatively flat and smooth surface, and can be applied easily. These protective layers are typically applied in a thickness comparable to that of the leveling layer, preferably somewhat thinner.

The present scintillator is typically used in combination with one or more of an image detecting device, an image forming device, an (image) amplifier, an image intensifier, an image processor, such as a computer, and a monitor.

In a second aspect the present disclosure relates to a use of the present scintillator for non-destructive applications, such as non-destructive testing, for (para) medical applications, such as one or more of dental inspection, such as intra oral and extra oral inspection, mammography, thorax inspection, and orthopedics.

For medical applications the use typically relates to radiography. A radiograph is an X-ray image of an object wherein heavier parts, such as bones, or lighter parts, such as lungs, can be made visible. A patient is subjected to X-ray radiation and an image is made. Typically radiographs are used for detection of pathology and diseases. Examples are thorax inspection, abdominal inspection, gallstones inspection, kidney stones inspection, orthopedics inspection and mammography.

Also dental radiography is commonly used.

For each diagnoses a suitable X-ray energy is determined.

In some applications an image is taken in combination with a contrast agent.

An advanced technique relates to computed tomography or CT.

Also real-time moving images of internal structures of a patient may be obtained. Therein use can be made of a fluorescent screen.

In a third aspect the present disclosure relates to an X-ray detector comprising the present scintillator.

In a fourth aspect the present disclosure relates to a method of producing an improved scintillator according to the disclosure, comprising the steps of
providing a substrate plate layer, and a scintillator layer, and
depositing a first hermetic high density moisture barrier layer by using atomic layer deposition.

In an example the present method further comprises the step of depositing an adhesion layer, preferably a silane adhesive layer.

The disclosure is further detailed by the accompanying figures and examples, which are exemplary and explanatory of nature and are not limiting the scope of the disclosure. To the person skilled in the art it may be clear that many variants, being obvious or not, may be conceivable falling within the scope of protection, defined by the present claims.

In FIG. 1 a SEM image of a pillar structure is shown. Clearly visible are tops of many pillars, typically CsI pillars. A cross section diameter of a pillar is in the order of 7-8 μm. In between pillars an open space is typically present.

In FIG. 2 a schematic cross-section of a scintillator is given. Therein the following layers are identified: 1=Substrate; 2=Scintillator layer; 4=Leveling layer; 5=Moisture barrier; and 6=Protective layer. The leveling and protective layer are typically formed from Parylene-C.

In FIG. 3 a schematic cross-section of a scintillator is given. Therein the following layers are identified: 1=Aluminum substrate; 2=Scintillator layer; 3=adhesion layer; 4=Leveling layer; 5=Moisture barrier; and 6=Protective layer.

In FIG. 4 a schematic cross-section of a scintillator is given. Therein the following layers are identified: 1=Carbon substrate; 2=Scintillator layer; 3=adhesion layer; 4=Leveling layer; 5=Moisture barrier; 6=Protective layer; and 7=Reflector.

Figure 5:
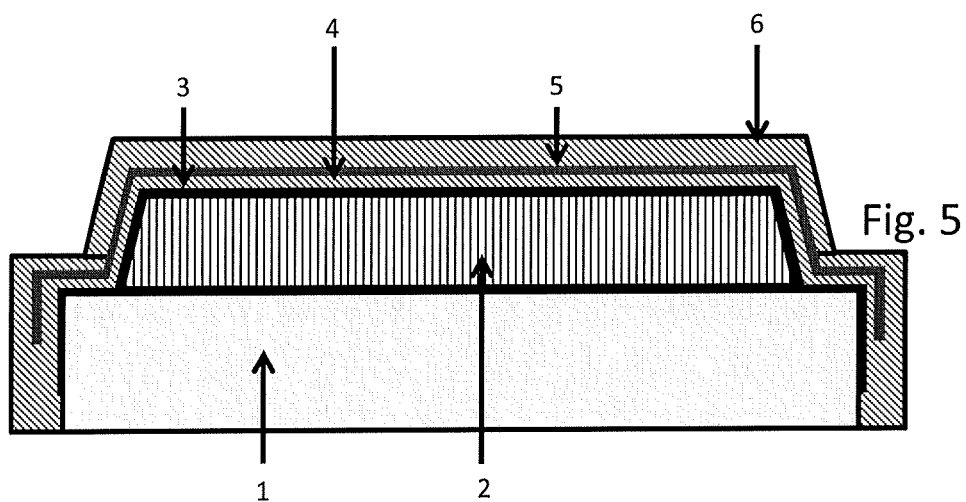

In FIG. 5 a schematic cross-section of a scintillator is given. Therein the following layers are identified: 1=FOP substrate; 2=Scintillator layer; 3=adhesion layer; 4=leveling layer; 5=moisture barrier; and 6=protective layer.

Figure 6:
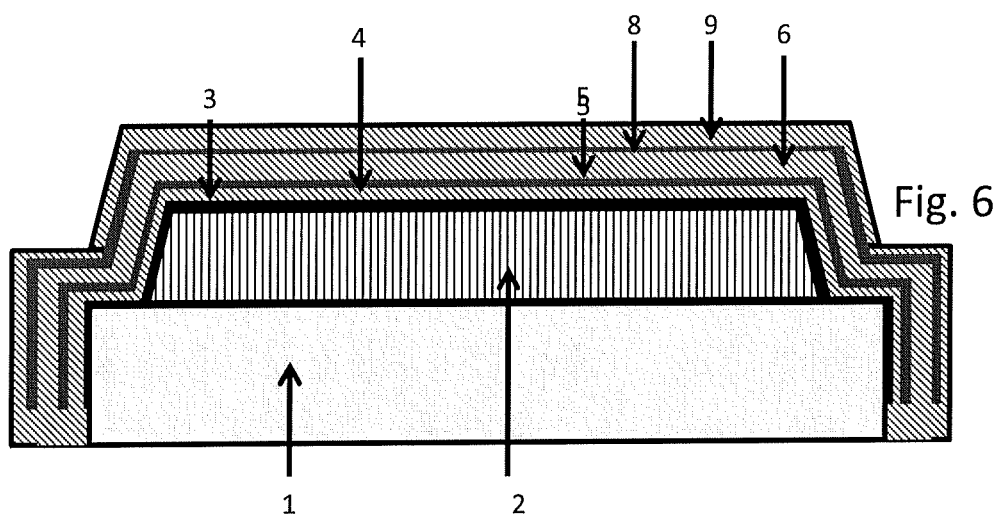

In FIG. 6 a schematic cross-section of a scintillator is given. Therein the following layers are identified: 1=FOP substrate; 2=Scintillator layer; 3=adhesion layer; 4=Leveling layer; 5=Moisture barrier; 6=Protective layer; 8=Second moisture barrier; and 9=Second protective layer.

Figure 7:
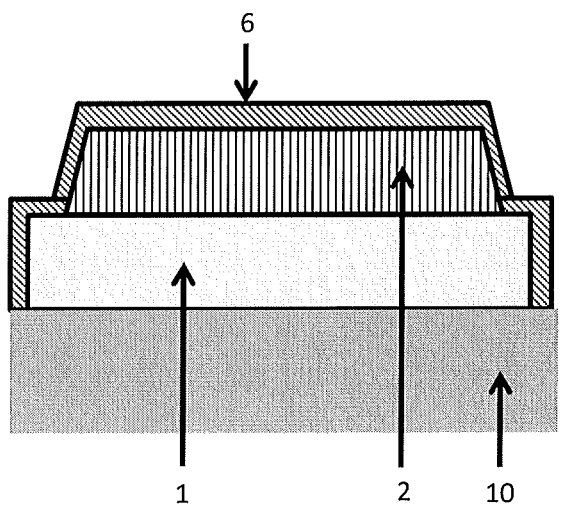

In FIG. 7 a schematic cross-section of a scintillator is given. Therein the following layers are identified: 1=FOP substrate; 2=Scintillator layer; 6=Protective layer; and 10=Sensor.

Figure 8:
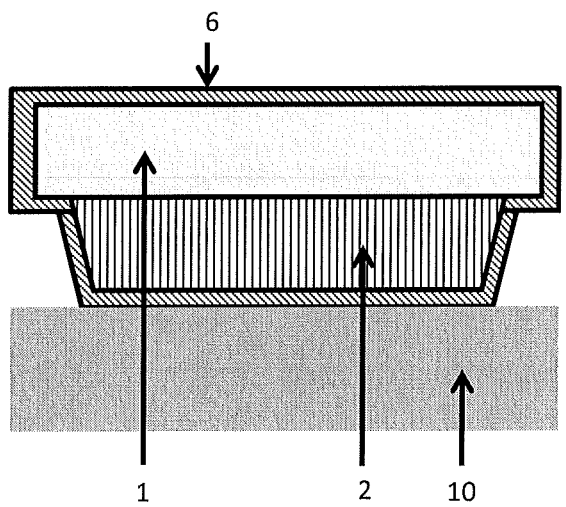

In FIG. 8 a schematic cross-section of a scintillator is given. Therein the following layers are identified: 1=Aluminum substrate; 2=Scintillator layer; 6=Protective layer; and 10=Sensor.

The figures are further detailed in the description and in the experiments below.

The disclosure although described in detailed explanatory context may be best understood in conjunction with the accompanying examples and figures.

Experiments with different thicknesses of leveling layer, barrier layer and protective layer have been performed. It has been identified that the thickness of the layer stack affects the MTF: a thinner layer improves the MTF. It is shown that the leveling layer thickness and likewise the protective layer thickness have a significant impact on the MTF of the scintillator plate. In an example the MTF drops linearly from about 59% (@1 lp/mm) at a (combined) thickness of 1 μπι to about 53% at a thickness of 20 μπι (best fit: MTF=−0.4 thickness +59.5%).

Experiments in view of the image noise have been performed. Noise is described by Noise Power Spectrum (NPS). Noise power spectrum displays the frequency distribution of the noise across the spatial spectrum and it shows the shift in the noise spectrum that is the cause of the change in appearance of the total noise. A standard NPS measurement is given in IEC 62220-1 (ed. 1, 2003). In the example the standard NPS measurement is normalized, by dividing by the average of linearized data, and by taking a $-^{10}\log$ of the average NPS.

It is noted that in principle a single barrier layer may be used. Although such a structure (with a single inorganic layer) can keep the MTF value at a sufficient level, the image noise power increases over the course of time (under moist air). On the contrary, inorganic multilayer structures (nanolaminate) maintain the noise power of the image at a sufficiently low level. It has been found experimentally that ALD provides a robust inorganic barrier e.g. compared to other techniques (like CVD, PECVD or sputtering). It has been found that if a same thickness is used for various inorganic layers, in comparison an ALD layer shows more robust barrier performance. Also a film density is higher.

It is noted that the present ALD layer performance (in terms of water vapor transmission rate) is as good as $10^{-3}$ (g/m$^2$/day), and typically less than $5*10^{-4}$(g/m$^2$/day), such as less than $2.5*10^{-4}$ (g/m$^2$/day); these values are considered to express and quantify the term "hermetic". In order to reach this value by using another technique, relatively thick and/or complex structures are needed; and even than the best reported value is $1.64*10^{-3}$ (g/m$^2$/day) (at least 60% worse than the present layer, but typically at least a factor 3-10 worse. There is no indication in the prior art that the layers presented there are really hermetic.

A use of ALD now makes it possible to use a much thinner protective and/or leveling layer. The total thickness of the stack of layers is thinner and therefore the achieved MTF is higher.

In table 1 it is shown that a thicker leveling layer (parylene) gives a higher drop in initial MTF. Further it is shown that a thicker leveling layer is needed for a thicker CsI layer. A 3 μm leveling layer on top of a 600 μm CsI layer is too thin to form a good moisture barrier, resulting in a larger MTF drop (−20.4%). A 3 μm leveling layer on top of a 120 μm CsI layer provides sufficient results.

TABLE 1

Impact of CsI thickness and leveling layer thickness on MTF (before and after climate testing (40° C. and 93% RH)).

| Thickness | | MTF [at 1 lp/mm] | | |
|---|---|---|---|---|
| CsI [um] | Parylene [um] | Initial [%] | After climate test [%] | Drop [%] |
| 120 | 3 | 82.8 | 82.7 | −0.1 |
| 120 | 8 | 74.9 | 74.6 | −0.4 |
| 600 | 3 | 65.6 | 52.2 | −20.4 |
| 600 | 8 | 63.1 | 60.7 | −3.8 |

As a substrate a FOP was used.

The impact of parylene thickness on MTF before and after climate testing is further investigated. In an example an aluminum substrate was used with a 600 m CsI layer. It is shown that the initial MTF drops from about 60% (at 1 lp/mm) for a 1 m parylene layer to 50% (at 1 lp/mm) when a 20 μm parylene layer is used. It is also shown that a thicker parylene layer gives a smaller MTF drop after climate testing (as above) (likewise form about 9% for a 1 μm parylene layer to 42% (at 1 lp/mm) when a 20 μm parylene layer is used).

It has been identified experimentally that if thicker CsI:T1 layers are used, the leveling layers also have to be thicker. It is believed that such relates to covering the gaps between the cone-like pillars which give a larger surface roughness of the CsI:T1.

By use of ALD, which has been found to seal pinholes very effectively, some examples of scintillator CsI thickness and leveling layer thickness are:
a) CsI:T1 Thickness: 400 μm; leveling layer thickness: typically 8 μm;
b) CsI:T1 Thickness: 600 μm; Leveling Layer thickness: «lO μm or 12 μm;
c) Thinner CsI (120 μm to 150 μm) can have about 3 μm thick leveling layer.

In summary it has been found that use of ALD makes it possible to have a well insulating stack of layers on top of CsI which can be thinner than with other type of non-ALD barrier layers, which improves the MTF.

It should be appreciated that for commercial application it may be preferable to use one or more variations of the present system, which would similar be to the ones disclosed in the present application and are within the scope of the disclosure.

The invention claimed is:

1. A scintillator for X-rays, the scintillator comprising:
a substrate plate layer;
a first moisture barrier layer; and
and a scintillator layer between the substrate plate layer and the first moisture barrier layer; and
a levelling layer on the scintillator layer and between the scintillator layer and the first moisture barrier layer, wherein the levelling layer covers spaces defined by pillars of the scintillator layer;
wherein the first moisture barrier layer has a thickness of between 10 nanometers (nm) and 1000 nm, and the first moisture barrier layer comprises two or more layers each individually having a thickness of between 0.5 nm and 100 nm wherein at least one subsequent layer is different from a previous layer.

2. The scintillator according to claim 1, wherein the substrate plate layer is selected from an aluminum (Al) plate, a fiber optic plate, and a carbon plate.

3. The scintillator according to claim 1, wherein a scintillating material of the scintillator layer material is selected from crystalline caesium iodide (CsI), and thallium iodide (T1I), such as doped or undoped Cs1.

4. The scintillator according to claim 1, wherein the scintillating material of the scintillator layer is a pillar type structure.

5. The scintillator according to claim 1, wherein the first moisture barrier layer comprises 3-50 layers, and wherein the first moisture barrier layer has a thickness between 20 nm-500 nm.

6. The scintillator according to claim 1, wherein the scintillator layer is covered with an adhesion layer.

7. The scintillator according to claim 1, further comprising: one or more of a first protective layer, a second protective layer, and a second moisture barrier layer, and wherein the levelling layer has a thickness of 1-5% of a thickness of the scintillator layer.

8. The scintillator according to claim 1, wherein the first moisture barrier layer and a second moisture barrier layer comprise layers, each layer comprising a material, individually selected from metals, metal oxides, metal nitrides.

9. The scintillator according to claim 6, wherein the adhesion layer comprises a material selected from saturated linear and branched hydrosilicons.

10. The scintillator according to claim 1, wherein the levelling layer comprises a material selected from aromatic polymers.

11. The scintillator according to claim 1, further comprising a first and second protective layer comprising a material, each individually, selected from aromatic polymers.

12. Use of the scintillator according to claim 1 for non-destructive applications, for medical applications, or for orthopedics.

13. An X-ray detector comprising the scintillator according to claim 1 and a sensor.

14. A method of producing an improved scintillator, comprising the steps of:
   providing a substrate plate layer, and a scintillator layer,
   depositing a levelling layer on the scintillator layer, wherein the levelling layer covers spaces defined by pillars of the scintillator layer; and
   depositing a first hermetic moisture barrier layer over the levelling layer by using atomic layer deposition (ALD), wherein the scintillator layer is positioned between the substrate plate layer and the first hermetic moisture barrier layer and the first hermetic moisture barrier layer has a thickness of 10 nanometers (nm)-1000 nm, and the first moisture barrier layer comprises two or more layers each individually having a thickness of 0.5 nm-100 nm.

15. The method according to claim 14, further comprising depositing an adhesion layer.

16. The method according to claim 14, further comprising one or more steps of:
   depositing a first protective layer,
   depositing a second protective layer, and
   depositing a second moisture barrier layer.

17. The method according to claim 16, wherein the depositing of the first protective layer or a second protective layer uses a chemical vapor deposition (CVD) or ALD.

18. The method according to claim 14, further comprising providing a reflector between the substrate plate layer and the scintillator layer.

19. The method according to claim 14, wherein the first moisture barrier layer comprises 3-50 layers, and wherein the first moisture barrier layer has a thickness of 20 nm-500 nm.

20. The method according to claim 14, wherein:
   the substrate plate layer is selected from an aluminum (Al) plate, a fiber optic plate, and a carbon plate, and
   a scintillating material of the scintillator layer is selected from crystalline caesium iodide (CsI), and thallium iodide (TlI), such as doped or undoped CsI.

* * * * *